United States Patent
Festa et al.

(10) Patent No.: US 6,676,800 B1
(45) Date of Patent: Jan. 13, 2004

(54) PARTICLE CONTAMINATION CLEANING FROM SUBSTRATES USING PLASMAS, REACTIVE GASES, AND MECHANICAL AGITATION

(75) Inventors: John J. Festa, McKinney, TX (US); Darryl Bennett, Dallas, TX (US); Joel Brad Bailey, Dallas, TX (US); Lawrence J. Overzet, Plano, TX (US); Marwan H. Khater, Dallas, TX (US); Siva K. Kanakasabapathy, Richardson, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/525,556

(22) Filed: Mar. 15, 2000

(51) Int. Cl.[7] ................................................ H05H 1/00
(52) U.S. Cl. ....................... 156/345; 134/1.1; 134/1.2
(58) Field of Search ................... 156/345; 134/1.1, 134/1.2, 1.3; 438/905; 118/723 R, 723 E; 216/67, 71; 204/298.06, 298.07, 298.33, 298.34

(56) References Cited

U.S. PATENT DOCUMENTS

| | | |
|---|---|---|
| 5,427,621 A | 6/1995 | Gupta |
| 5,531,862 A | 7/1996 | Otsubo et al. |
| 5,779,807 A | 7/1998 | Dorntest et al. |
| 5,790,365 A * | 8/1998 | Shel ............................ 361/234 |
| 5,849,135 A | 12/1998 | Selwyn |
| 6,125,859 A * | 10/2000 | Kao et al. ..................... 134/1.1 |

* cited by examiner

*Primary Examiner*—Gregory Mills
*Assistant Examiner*—P. Hassanzadeh
(74) *Attorney, Agent, or Firm*—Moser Patterson & Sheridan (57) ABSTRACT

A method and apparatus for cleaning semiconductor wafers, next generation lithography (NGL) masks, and optical photomasks as well as test wafers and in service NGL and optical masks is disclosed. The method and apparatus utilize reactive gases and gas mixtures and mechanical agitation to enhance particle removal. The addition of a reactive gas process to an inert gas feed enhances the plasma cleaning process by breaking chemical bonds which form between surface particles and a substrate, consequently improving cleaning efficiency.

37 Claims, 4 Drawing Sheets

PARTICLE CONTAMINATION CLEANING FROM SUBSTRATES USING PLASMAS, REACTIVE GASES, AND MECHANICAL AGITATION

BACKGROUND

The inventions disclosed herein relate to the cleaning of semiconductor wafers, next generation lithography (NGL) masks, and optical photomasks during their manufacture, and more particularly to the cleaning of semiconductor wafers, NGL masks, and optical photomasks by the use of plasma gases, reactive gases, and mechanical agitation.

Particle contamination on semiconductor substrates can cause defects in finished semiconductor devices resulting in yield loss and/or reduced reliability of semiconductor devices. Accordingly, the semiconductor manufacturing industry has paid considerable attention to maintaining high standards of cleanliness during the manufacture of semiconductor devices, and clean room technology has evolved to a level such that particle deposition onto substrates from exposure to the clean room is only a minor source of substrate contamination. Rather, most of the contamination found on substrates derives from process tools, processing materials, and interior walls of the processing chamber. Accordingly, substrates must be cleaned before, during, and after many of the processes steps they must undergo to become a finished semiconductor device. NGL masks pose an additional need due to the fact that these masks cannot employ the protective pellicle covering which prevents particle contamination on traditional masks. Cleaning accounts for approximately 30 percent of the processing performed on semiconductor fabrication line.

U.S. Pat. No. 5,849,135 to Selwyn, the disclosure of which is herein incorporated by reference, describes a system for particle contamination removal from circular semiconductor wafers using plasmas and mechanical agitation. Generally, the Selwyn Patent describes a method and apparatus in which particulate matter can be removed from the surface of a wafer by forming an RF plasma sheath in the vicinity of the surface of a wafer such that the wafer surface is bombarded by positive ions and electrons from the plasma. Mechanical resonance vibration means are used to introduce vibrations in the wafer perpendicular to its surface thereby breaking the bonds between the particulate matter and the substrate such that particulate matter is caused to move away from the surface of the wafer and into the plasma sheath. Once free of the wafer surface, the particulate matter becomes negatively charged by the electrons in the plasma and are drawn into the plasma by attractive forces which keep them from redepositing. The introduction of a flowing gas through the plasma sweeps the particulate matter away from the wafer and out of the plasma.

Figure 1:
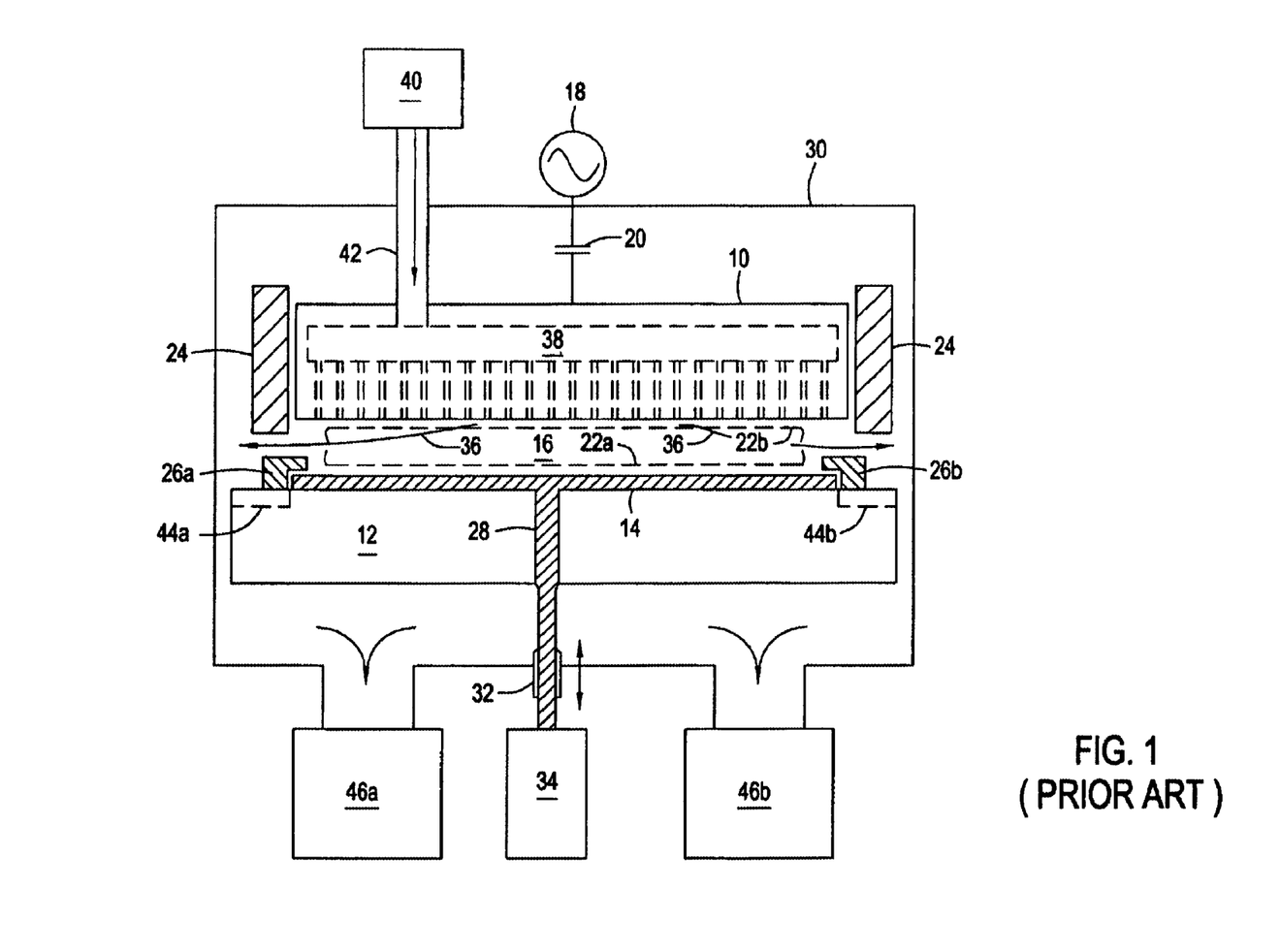
FIG. 1 is a cross-sectional side view of the cleaning apparatus of the present invention.

More specifically and with reference to FIG. 1 of the Selwyn Patent, the cleaning apparatus depicted therein is comprised of a vacuum chamber which includes a circular shaped RF electrode and a circular shaped ground electrode. The RF electrode is capacitively coupled to an RF power source. A retaining ring is suspended above the wafer to restrict the wafer's travel. Plasma is formed between the RF electrode and the ground electrode when RF energy is applied to the RF electrode by the RF power source. The plasma sheath is located above the semiconductor wafer and below RF electrode. The semiconductor wafer is caused to vibrate at approximately 10 kHz by means of a conducting post which passes through the walls of the vacuum chamber and which is driven by a mechanical vibrator.

Gas, preferably a noble gas such as helium or neon is introduced into the vacuum chamber via an inlet tube thereby establishing a radial gas flow. A pair of vacuum pumps permit the vacuum chamber to be operated at 1–10 torr while the radial gas flow is generated. Strong drag forces generated by the high gas flow rate drive the particulate matter out of the plasma and into the pumping ports of the chamber.

However, the plasma cleaning process described in the Selwyn Patent does not remove all contaminant particles from a wafer. Experience has shown that the cleaning efficiency of the method described in the Selwyn Patent (i.e., the number of particles on the wafer prior to plasma cleaning less the number of particles on the wafer after the cleaning process divided by the number of particles on the wafer prior to plasma cleaning and multiplied by 100) is approximately 70 percent for W particles at 1.25 micron size. Nowhere does the Selwyn Patent, or any other prior art known to the inventors, teach or suggest the use reactive gases to improve the cleaning efficiency of a plasma cleaning process by breaking the chemical bonds between contaminant matter and a silicon wafer. Indeed, the Selwyn Patent at Col. 6, lines 26–30 explicitly teaches away from the use of reactive gases. Additionally, nowhere in the prior art is it taught or suggested that broadband or impulse vibration means can be used to agitate the substrate.

SUMMARY OF INVENTION

Accordingly, it is an object of the present invention to provide a reactive plasma cleaning method and apparatus having an increased cleaning efficiency.

Additionally, it is an object of the present invention to provide a plasma cleaning method and apparatus utilizing broadband or impulse vibration means.

Further, it is an object of the present invention to provide a reactive plasma cleaning process that can be used for the cleaning of a variety of devices including NGL masks and optical photomasks as well as semiconductor wafers.

It is further an object of the present invention to provide a reactive plasma cleaning process and apparatus that may be used to clean contaminant particles of various chemical compositions from a variety of substrate compositions.

DETAILED DESCRIPTION OF THE INVENTION

The invention described herein provides an improved plasma cleaning process which can be employed in the manufacture of semiconductor wafers, next generation lithography (NGL) masks, and optical masks as well as test wafers and in service NGL and optical masks. More specifically, the present invention utilizes reactive gases and gas mixtures to enhance particle removal in the plasma cleaning process described in the Selwyn Patent. The addition of a reactive gas process to an inert gas feed enhances the plasma cleaning process by breaking chemical bonds which form between surface particles and a substrate, consequently improving cleaning efficiency. Broadband excitation also shows improved cleaning efficiency.

FIG. 1 depicts a cross sectional view of the substrate cleaning apparatus of the instant invention which, except as noted herein, is essentially identical to the cleaning apparatus described in the Selwyn Patent. As shown in FIG. 1, included within vacuum chamber 30 is RF electrode 10, which is spaced-apart (about 15 mm) from, and generally parallel to, ground electrode 12 on which rests semiconductor wafer 14. Plasma 16 is established and sustained between electrodes 10 and 12 when RF energy is applied to RF electrode 10 by RF power source 18 through capacitor 20. The plasma boundaries 22a and 22b (i.e., the plasma sheaths) are located above wafer 14 and below RF electrode 10.

Annular ground shield 24 which surrounds RF electrode 10 reduces the spread of plasma 16 away from the surface of wafer 14. Clamps 26a and 26b prevent wafer 14 from having significant motion either perpendicular or parallel to the surface of ground electrode 12 but allow some motion in both of these directions and ground the wafer. Alternatively, clamps 26a and 26b may be electrically isolated for application of a DC or AC bias potential. Wafer 14 is caused to vibrate at a resonance frequency of about 1 kHz by post 28 which passes through the walls of vacuum chamber 30 which houses the electrode structure, with the aid of vacuum feed through 32. Post 28 is driven by mechanical vibrator 34. In an alternate embodiment of the present invention described in more detail below, broadband excitation is used for wafer agitation.

Gas flow 36 radial to RF electrode 10 is provided by gas showerhead 38 where Argon (Ar) gas having one percent nitrogen trifluoride ($NF_3$) from gas source 40 is introduced by inlet tube 42 at a flow rate of approximately 2500 sccm. Alternatively other noble gases such as helium and neon containing $NF_3$ may also be used. Further, the concentration of the reactive $NF_3$ gas may be varied, however, it has been found that increasing the concentration of $NF_3$ gas by as little as two percent induces an undesirable degree of surface damage. This surface damage may be seen by the measurement technique as a particle. Radial channels 44a and 44b are formed in electrode 12 to provide preferred electrical pathways for the plasma. Preferably, these channels have a width and depth between 0.5 and 4 times the thickness of the plasma sheath. Vacuum pumps 46a and 46b permit vacuum chamber 30 to be operated at 2600 mTorr while the radial gas flow from showerhead 38 is generated.

Unlike the inert plasma cleaning process described in the Selwyn Patent, the addition of the reactive $NF_3$ gas breaks the chemical bonds holding particles to a substrate, thereby facilitating their removal. Additionally, when small particles are sought to be removed, the $NF_3$ reactive gas may etch the particles directly to effect their removal rather than breaking the bonds between the particles and the substrate. The reactive chemistry can also be used to attack or etch both the base material of the particles as well as oxides or other bonds which form between the particle and the substrate.

Tests conducted under the conditions summarized in Table 1 demonstrate the improved cleaning efficiency of the reactive gas method described herein to that of the method described in the Selwyn Patent.

TABLE 1

| Parameter | Value |
| --- | --- |
| Plasma Source | Capacitively Coupled |
| Pressure | 2600 mTorr |
| Total flow | 2500 sccm |
| Substrate Material | Silicon (Si) |
| Contaminant Material | Tungsten (W) |
| Contaminant Particle Size | 1.25 microns |
| Plasma Gas | Argon (Ar) |
| Reactive Gas | Nitrogen Trifluoride ($NF_3$) |
| Reactive Gas Concentration | 1% |

Figure 2:
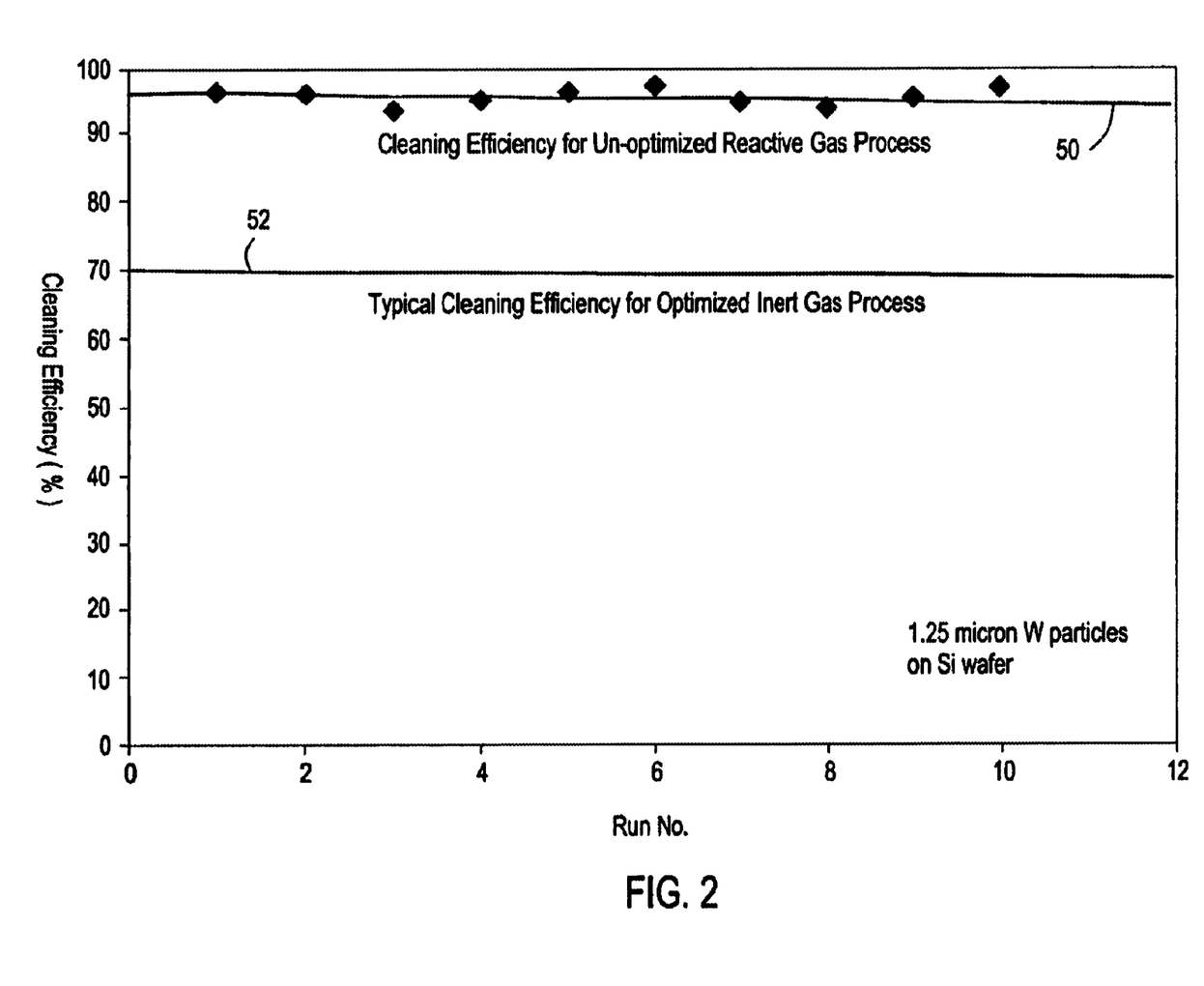
FIG. 2 is a graphic illustration depicting test results demonstrating the improved cleaning efficiency of the instant invention.

Testing was conducted over ten replicates (i.e., test runs) to verify both the improved cleaning efficiency and the consistency of the inventive process described herein. FIG. 2 graphically illustrates test results demonstrating the improved cleaning efficiency for the reactive gas process of the instant invention as compared to the typical cleaning efficiency for the optimized inert gas process described in the Selwyn Patent. As shown by line 50 of FIG. 2 the cleaning efficiency of the inventive method averaged 96 percent for 1.25 micron W particles over the ten test runs, an improvement of 26 percent over the typical 70 percent cleaning efficiency (shown by line 52 of FIG. 2) of the cleaning process disclosed in the Selwyn Patent.

The reactive $NF_3$ gas was selected to enhance the removal of W particles from a Si substrate because $NF_3$ etches W as well as W oxides and Si. As mentioned above, the mechanism for the improved cleaning efficiency of the instant invention is breaking or etching the bonds holding a particle to a substrate. To verify that the improved cleaning efficiency was in part due to reactive gas breaking or etching of bonds holding a particle to a substrate, testing was conducted using 1 to 5 micron chromium Cr particles on a Si substrate under the conditions shown in Table 2. Those skilled in the art will understand that Cr and chromium oxide (CrO) do not etch when subject to $NF_3$ chemistry.

TABLE 2

| Test Conditions | |
| --- | --- |
| Parameter | Value |
| Plasma Source | Capacitively Coupled |
| Pressure | 2600 mTorr |
| Total flow | 2500 sccm |
| Substrate Material | Silicon (Si) |
| Contaminant Material | Chromium (Cr) |
| Contaminant Particle Size | 1–5 microns |

Testing was conducted using the inert gas process described in the Selwyn Patent and with the reactive gas process described above with respect to FIG. 2. As shown by the test results in Table 3 below, the addition of $NF_3$ to the inert gas does not improve the cleaning efficiency for Cr particles on Si substrates, and, in fact, may reduce the cleaning efficiency by a few percent. Thus, the test results verify that the reactive $NF_3$ gas does increase the cleaning efficiency by breaking the bonds holding particles to a substrate.

TABLE 3

Test Results

|  | 0% NF$_3$ | 1% NF$_3$ |
|---|---|---|
| Cleaning Efficiency | 88.2 | 84.1 |

Vibration Source

As mentioned above, in the preferred embodiment of the instant invention broadband excitation is used to agitate the substrate. However, resonance vibration as described in the Selwyn Patent may also be used. Broadband excitation of the substrate may be achieved using an impulsive type actuation force, conceptually similar to a hammer blow. This method excites many vibratory frequencies in the substrate and contaminant rather than a single dominant frequency as when resonance excitation is used. The probability of displacing and subsequently removing a given particle is substantially increased when using this excitation method resulting in superior cleaning efficiency. Broadband excitation represents a substantial process improvement over the prior art due to process performance improvements.

The nature of resonant excitation implies a sinusoidal driving force. Substrate acceleration is also sinusoidal which means that acceleration magnitudes are roughly equal in both positive and negative directions with respect to a substrate holder or "chuck." This has significant implications for the chuck and clamp design in that the clamp must be placed over the wafer, at least at the edges, to hold the wafer in place during the negative portion of travel. In many processing applications it is not desirable, for particle generation or other reasons such as edge exclusion, to have a clamp or other structure over the wafer.

Impulse (broadband) excitation alleviates many of the engineering and process limitations encountered with resonance excitation because a asymmetrical acceleration pulse can be imposed on the substrate. In this way, a positive acceleration pulse can be used to excite broadband vibration in the substrate. This fast rising positive pulse excites substrate vibration while forcing the substrate into the chuck but not subsequently against a clamp structure as the pulse is asymmetrical. This effect can be utilized to greatly improve and enhance substrate handling and clamping systems. Utilization of this effect allows use of non-invasive clamp techniques such as electrostatic chucks or edge clamps which have no physical clamp over the surface of the wafer. It is important to understand that the asymmetrical pulse concept is a subset of broadband excitation in that broadband excitation can be used to produce a symmetrical pulse, a bidirectional pulse, or combinations of each case.

Multiple methods can be used to excite a broadband vibration in the substrate. The simplest case is a hammer like impact from a mechanical actuator onto the substrate or more preferably substrate holder and chuck assembly. Experimentation has shown that higher acceleration levels can be sustained by impacting a substrate carrier or chuck structure rather than the substrate as the impact site on a substrate can also act as a failure nucleation site. This excitation method primarily excites vibration in the substrate with subsequent secondary excitation of adhered particulate contaminants.

An extension of the hammer blow concept uses a linear actuator to move the entire chuck/substrate assembly at some velocity until it contacts a hard stop. An impact excitation is realized upon contacting the hard stop with an acceleration pulse generated in a direction determined by the direction of substrate travel.

Further, an acoustic pulse, rather than a mechanical impact, can be used to excite broadband substrate and contaminant vibration. In this method an impulsive pressure pulse is applied to either the front or back side of the substrate. Depending on the nature of the acoustic pulse used either the substrate or the contaminant can be primarily excited. Other forms of energy can also be used to excite vibration. In cases where particulate contaminants are magnetic in nature a magnetic or electromagnetic pulse, such as from an electromagnet, can be used to excite vibration. In this case vibration is excited primarily in the contaminant and secondarily in the substrate. In a similar scenario, a substrate with a magnetic material either integrated into the bulk or deposited on the surface can be primarily excited via a magnetic or electromagnetic driving pulse.

All excitation methods discussed can utilize either open loop or closed loop process control. In the case of open loop control known excitation is achieved by setting a driver input level based on a previously conducted calibration. For closed loop control a feedback sensor(s) is included in the actuator system to measure directly or indirectly substrate response to the excitation input and correct driver levels to achieve a desired response. This approach also allows for real-time process monitoring for quality assurance and process control purposes.

Plasma Source

Rather than using a capacitively coupled plasma (CCP) source, the power source may be inductively coupled to the plasma or other high density plasmas may be used. As discussed below, use of an inductively coupled (ICP) plasma source increases the selectivity of the etching process. Additionally, a DC or AC bias on the substrate may be desirable for certain plasma chemistries to balance ion flux with incident ion energy. This is especially true in cases where the etch products may have relatively low vapor pressures, consequently requiring some ion assist to remove them from the surface. Bias can also be useful when controlling heating effect as temperature rise can be strongly influenced by incident ion energy. Further, a thermal gradient may be created in the vacuum chamber to prevent particles that have been lifted of the substrate from being redeposited.

Selectivity

Figure 3A:
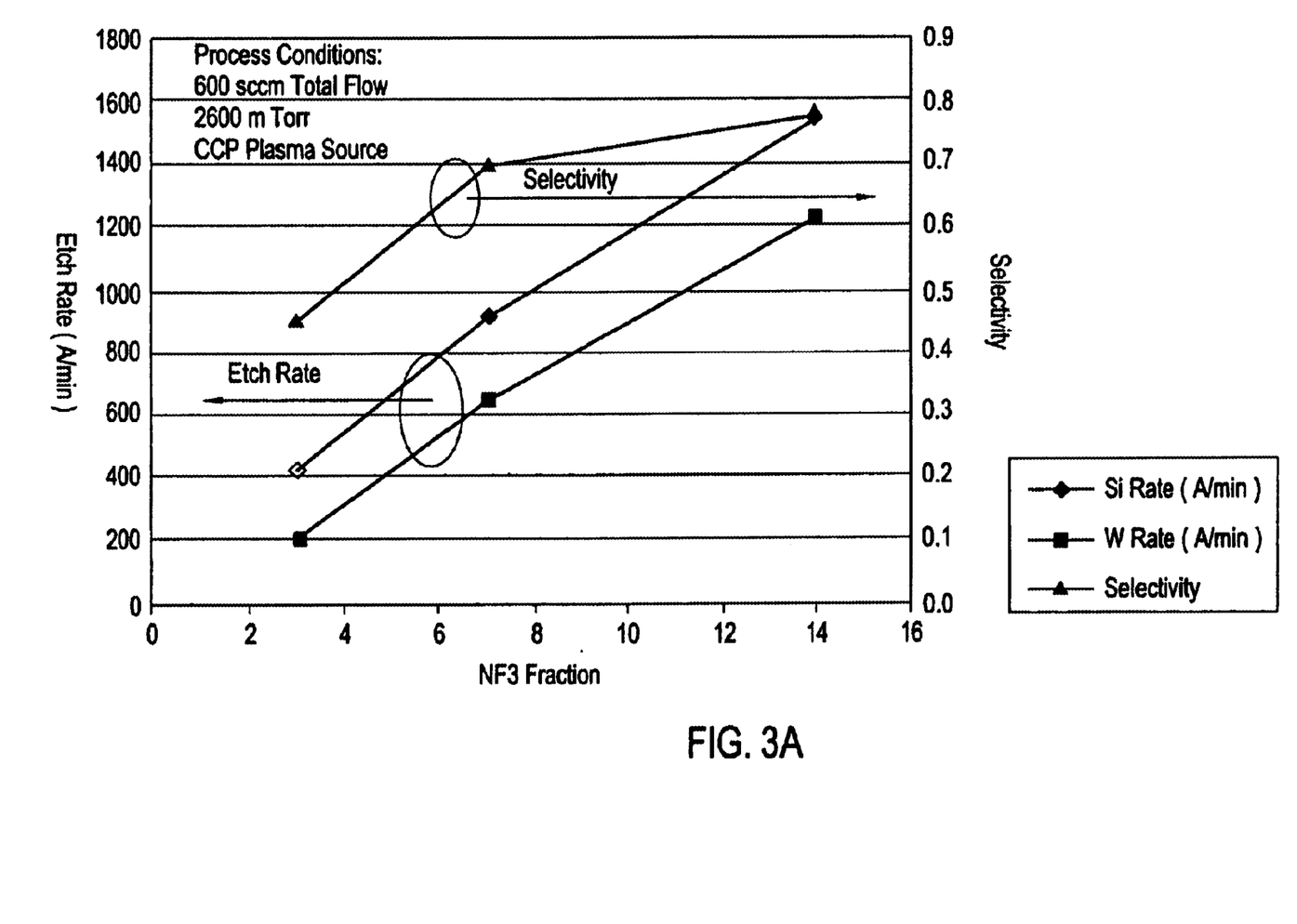
FIG. 3a is a graphic illustration depicting the etch rate of Si and W and selectivity of various $NF_3$ concentrations using a capacitively coupled plasma source.
Figure 3B:
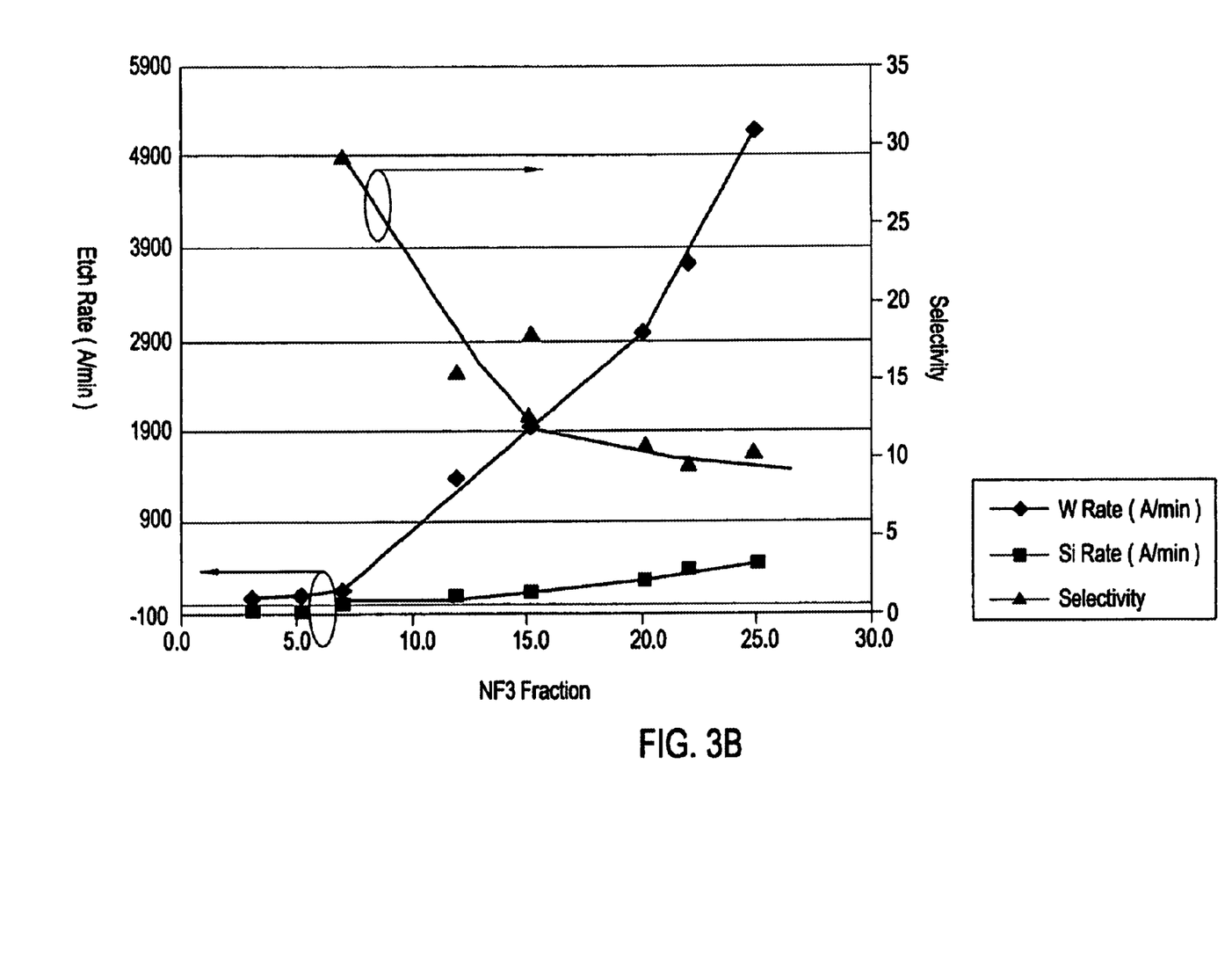
FIG. 3b is a graphic illustration depicting the etch rate of Si and W and selectivity of various $NF_3$ concentrations using a inductively coupled plasma source.

Selectivity (i.e., the ability to etch off or attack the contaminant particle to as great of a degree as possible without etching or damaging the substrate) is an important consideration in the reactive gas process. There are many well known techniques to control selectivity. Some of these techniques include varying process pressure regime, power density, gas flow, gas mixture, and thermal properties. Gas mixture and thermal effects require some specific discussion. FIGS. 3a and 3b show the convolved effect of pressure, power density and gas flow in comparing etch results for a capacitively coupled (CCP) and inductively coupled (ICP) power source, respectively.

As shown in FIGS. 3a and 3b, the selectivity trends for the ICP source are generally more favorable as selectivities much greater (i.e., up to approximately 20) can be achieved, meaning that W contaminant particles are etched 20 times faster than the Si wafer. With the CCP source selectivity is approximately 0.5.

A thermal effect is thought to be at least partially responsible for the improved selectivity seen in the ICP process. In general, heating in a low pressure, high density plasma (such as an ICP) is greater due to increased plasma density and reduced neutral cooling due to the lower pressure. Reaction, and consequently etch rates are typically increased with increasing temperature. In addition, the W etch process is strongly exothermic providing additional thermal energy to the system. This effect can be utilized to improve selectivity when developing a reactive process for particle removal. Multiple mechanisms can be utilized to preferentially heat a surface particle with respect to the substrate. Examples include, but are not limited to, heating in a plasma environment as discussed above, heating by incident photon energy (IR lamp or laser beam) and heating due to chemical reaction.

Chemical mechanisms can also be employed to enhance selectivity. For example, a plasma chemistry can be selected which passivates the substrate followed by application of a chemistry which attacks the particle and bonds but does not attack the substrate due to passivation previously applied. In this scenario, gas feedstock contents are altered on a time varying basis during the process, potentially in concert with power density, pressure, and other process parameters. Another means of enhancing selectivity is through use of an etch process which is selective to crystalline defects. In this case preferential etching occurs at grain boundaries and dislocation type defects. This type of etch could be especially beneficial in attacking a particulate contaminant of the same composition as the substrate material. An example of this is the case of Si particles on a Si substrate. The defect density in the particulate should be much greater than that of the substrate, allowing a defect preferential etch to provide a measure of selectivity otherwise unobtainable for a Si on Si material pair.

Other Applications

Although the above discussion mainly addresses the cleaning of W particles from a Si semiconductor wafer, those skilled in the art will understand that the reactive gas process described herein may also be used to clean contaminants from next generation masks and optical masks by changing the composition of the reactive gas in accordance with the contaminant and substrate materials. Various gas mixtures can be used as appropriate to target material pair dependent chemical bonds.

For example, a reactive gas process that is applicable to removing particulate contaminants which form volatile reaction products with fluorine is described in Table 4. Examples of these contaminants include tungsten, silicon, silicon dioxide, and silicon nitride.

TABLE 4

| Parameter | Value |
| --- | --- |
| Total Gas Flow | 2500 sccm |
| $NP_3$ gas flow | 25 sccm |
| Ar gas flow | 2475 sccm |
| Process Pressure | 2600 mTorr |
| Power | 100 W RF power |
| Process Time | 45 seconds |

Another reactive gas process that is particularly applicable to cases where the particulate contaminant is an organic compound such as photoresist or where an organic residue (such as photoresist) is at least partially binding another particulate contaminant to the substrate surface is described in Table 5.

TABLE 5

| Parameter | Value |
| --- | --- |
| Total Gas Flow | 2500 sccm |
| $O_2$ gas flow | 125 sccm |
| He gas flow | 2375 sccm |
| Process Pressure | 2600 mTorr |
| Power | 100 W RF power |
| Process Time | 45 seconds |

Yet another reactive gas process uses multiple process steps to address multiple sources of particulate attachment to the substrate surface. The first step uses an oxygen descum type process to remove hydrocarbon or other organic films/contaminants bonding a particle to the substrate surface. The second process step uses a reducing agent, in this case hydrogen, to break oxide bonds holding the particulate contaminant to the substrate surface. The first step of this two step process is described in Table 6A while the second step is described in Table 6B.

TABLE 6A

Step 1

| Parameter | Value |
| --- | --- |
| Total Gas Flow | 2500 sccm |
| $O_2$ gas flow | 125 sccm |
| He gas flow | 2375 sccm |
| Process Pressure | 2600 mTorr |
| Power | 100 W RF power |
| Process Time | 30 seconds |

TABLE 6B

Step 2

| Parameter | Value |
| --- | --- |
| Total Gas Flow | 2500 sccm |
| Process Pressure | 2600 mTorr |
| Power | 100 W RF power |
| Process Time | 30 seconds |
| Inert Gas | Argon (Ar) |
| Reactive Gas | Hydrogen ($H_2$) |
| Reactive Gas Concentration | 5% |

Another reactive gas process using a combination of chlorine and oxygen to break bonds holding a particle to a substrate surface is described in Table 7. This chemistry is especially useful in (but not limited to) cases where the fluorine reaction products are not volatile, chromium for example but oxy-chloride compounds can be formed. In certain cases where volatile chlorides can be formed this process is equally as useful without the addition of oxygen.

TABLE 7

| Parameter | Value |
| --- | --- |
| Total Gas Flow | 2500 sccm |
| $O_2$ gas flow | 13 sccm |
| $C_{12}$ gas flow | 13 sccm |
| Ar gas flow | 2474 sccm |
| Process Pressure | 2600 mTorr |
| Power | 100 W RF power |
| Process Time | 30 seconds |

Those of ordinary skill in the art will understand that combinations of these process examples are also valid. Also the process values such as pressure, gas flows, power, can be varied by some amount, in some cases by a fairly wide margin, and still yield a functional process.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus for removing contaminant matter from the surface of a substrate comprising:
   (a) a vacuum chamber having a first electrode for supporting said substrate and a second electrode, said second electrode being spaced apart and substantially parallel to said first electrode,
   (b) means for securing said substrate to said first electrode,
   (c) means for introducing into said vacuum chamber a gas mixture comprising an inert gas and a reactive gas,
   (d) means for applying a voltage to said second electrode such that a plasma sheath is formed above said substrate, said substrate surface being bombarded by positive ions and electrons from said plasma, and said reactive gas degrading chemical bonds between said contaminant matter and said substrate surface,
   (e) means for applying a broadband impulse to said substrate such that said contaminant matter is caused to move away from said substrate surface and into said plasma sheath, and
   (f) means for purging said contaminant matter from said plasma.

2. The apparatus of claim 1 wherein said substrate is a Si semiconductor wafer and said gas mixture is comprised of Ar having 0.1 to 3 percent $NF_3$.

3. The apparatus of claim 2 wherein said gas mixture is comprised of Ar having approximately one percent $NF_3$.

4. The apparatus of claim 1 wherein said means for agitating said substrate induces a resonance vibration.

5. The apparatus of claim 1 wherein said means for applying a broadband impulse to said substrate comprises an acoustic pulse.

6. The apparatus of claim 1 wherein said means for applying a broadband impulse to said substrate comprises an magnetic pulse.

7. The apparatus of claim 6 wherein said vacuum chamber is maintained at 2200 to 3000 mTorr.

8. The apparatus of claim 6 wherein said vacuum chamber is maintained at approximately 2600 mTorr.

9. The apparatus of claim 1 wherein said means for applying a voltage to said second electrode is a capacitively coupled plasma source.

10. The apparatus of claim 1 wherein said means for applying a voltage to said second electrode is an inductively coupled plasma source and said vacuum chamber is maintained at less than 200 mTorr.

11. The apparatus of claim 1 wherein said means for purging said contaminant matter comprises the use of flowing gas to sweep the contaminant matter from said plasma.

12. An apparatus for removing contaminant matter from the surface of a substrate comprising:
   (a) a vacuum chamber having a first electrode for supporting said substrate and a second electrode, said second electrode being spaced apart and substantially parallel to said first electrode,
   (b) means for securing said substrate to said first electrode,
   (c) means for introducing into said vacuum chamber a gas mixture comprising an inert gas and a reactive gas,
   (d) means for applying a voltage to said second electrode such that a plasma sheath is formed above said substrate, said substrate surface being bombarded by positive ions and electrons from said plasma, and said reactive gas degrading chemical bonds between said contaminant matter and said substrate surface,
   (e) means for applying a broadband impulse to said contaminant matter such that it is caused to move away from said substrate surface and into said plasma sheath, and
   (f) means for removing said contaminant matter from said plasma.

13. The apparatus of claim 12 wherein said substrate is a Si semiconductor wafer and said gas mixture is comprised of Ar having 0.1 to 3 percent $NF_3$.

14. The apparatus of claim 13 wherein said gas mixture is comprised of Ar having approximately one percent $NF_3$.

15. The apparatus of claim 12 wherein said means for applying a broadband impulse to said contaminant matter comprises an acoustic pulse.

16. The apparatus of claim 15 wherein said means for applying a broadband impulse to said contaminant matter comprises a magnetic pulse.

17. The apparatus of claim 12 wherein said means for applying a voltage to said second electrode is a capacitively coupled plasma source.

18. The apparatus of claim 17 wherein said vacuum chamber is maintained at 2200 to 3000 mTorr.

19. The apparatus of claim 17 wherein said vacuum chamber is maintained at approximately 2600 mTorr.

20. The apparatus of claim 12 wherein said means for applying a voltage to said second electrode is an inductively coupled plasma source and the vacuum is maintained at less than 200 mTorr.

21. The apparatus of claim 12 wherein said means for purging said contaminant matter comprises the use of flowing gas to sweep said contaminant matter from said plasma.

22. An apparatus for removing contaminant matter from the surface of a substrate comprising:
   (a) a vacuum chamber having a first electrode for supporting said substrate and a second electrode, said second electrode being spaced apart and substantially parallel to said first electrode,
   (b) means for securing said substrate to said first electrode,
   (c) means for introducing into said vacuum chamber an inert gas,
   (d) means for applying a voltage to said second electrode such that a plasma sheath is formed above said substrate, said substrate surface being bombarded by positive ions and electrons from said plasma,
   (e) means for applying a single broadband impulse to said substrate such that said contaminant matter is caused to move away from said substrate surface and into said plasma sheath, and (f) means for removing said contaminant matter from said plasma.

23. The apparatus of claim 22 wherein said means for applying a single broadband impulse to said substrate comprises an acoustic pulse.

24. The apparatus of claim 22 wherein said means for applying a single broadband impulse to said substrate comprises a magnetic pulse.

25. The apparatus of claim 22 wherein said means for applying a voltage to said second electrode is a capacitively coupled plasma source.

26. The apparatus of claim 25 wherein said vacuum chamber is maintained at 2200 to 3000 mTorr.

27. The apparatus of claim 25 wherein said vacuum chamber is maintained at approximately 2600 mTorr.

28. The apparatus of claim 22 wherein said means for applying a voltage to said second electrode is an inductively coupled plasma source and the vacuum is maintained at less than 200 mTorr.

29. The apparatus of claim 22 wherein said means for purging said contaminant matter comprises the use of flowing gas to sweep said contaminant matter from said plasma.

30. An apparatus for removing contaminant matter from the surface of a substrate comprising:
  (a) a vacuum chamber having a first electrode for supporting said substrate and a second electrode, said second electrode being spaced apart and substantially parallel to said first electrode,
  (b) means for securing said substrate to said first electrode,
  (c) means for introducing into said vacuum chamber an inert gas,
  (d) means for applying a voltage to said second electrode such that a plasma sheath is formed above said substrate, said substrate surface being bombarded by positive ions and electrons from said plasma,
  (e) means for applying a broadband impulse to said contaminant matter such that it is caused to move away from said substrate surface and into the plasma sheath, and
  (f) means for removing said contaminant matter from said plasma.

31. The apparatus of claim 30 wherein said means for applying a broadband impulse to said contaminant matter comprises an acoustic pulse.

32. The apparatus of claim 30 wherein said means for applying a broadband impulse to said contaminant matter comprises a magnetic pulse.

33. The apparatus of claim 30 wherein said means for applying a voltage to said second electrode is a capacitively coupled plasma source.

34. The apparatus of claim 33 wherein said vacuum chamber is maintained at 2200 to 3000 mTorr.

35. The apparatus of claim 33 wherein said vacuum chamber is maintained at approximately 2600 mTorr.

36. The apparatus of claim 30 wherein said means for applying a voltage to said second electrode is an inductively coupled plasma source and said vacuum chamber is maintained at less than 200 mTorr.

37. The apparatus of claim 30 wherein said means for purging said contaminant matter comprises the use of flowing gas to sweep said contaminant matter from said plasma.

\* \* \* \* \*